United States Patent [19]

van der Steen

[11] Patent Number: 4,566,076

[45] Date of Patent: Jan. 21, 1986

[54] METHOD OF ATTENUATING A DIGITAL SIGNAL AND DEVICE FOR CARRYING OUT SAID METHOD

[75] Inventor: Antonie C. A. M. van der Steen, Eindhoven, Netherlands

[73] Assignee: U.S. Philips Corporation, New York, N.Y.

[21] Appl. No.: 671,146

[22] Filed: Nov. 13, 1984

Related U.S. Application Data

[63] Continuation of Ser. No. 337,645, Jan. 7, 1982, abandoned.

[30] Foreign Application Priority Data

Jan. 23, 1981 [NL] Netherlands ............................ 8100307

[51] Int. Cl.$^4$ ................................................ G06F 7/38
[52] U.S. Cl. ................................ 364/757; 340/347 DD
[58] Field of Search ............................ 364/715, 757; 340/347 DD

[56] References Cited

U.S. PATENT DOCUMENTS 4,181,970  1/1980  Izumi et al. ........................... 364/760

Primary Examiner—T. J. Sloyan
Attorney, Agent, or Firm—Thomas A. Briody; William J. Streeter; Leroy Eason

[57] ABSTRACT

In the method of attenuating or amplifying digital signal values as described herein the desired modification is realized in two steps.

A coarse attenuation or amplification in steps of 6 dB is effected by shifting the digital word to be modified into a shift register (R), after which fine amplification is realized by adding the word, which is attenuated by shifting it a number of times, to the word thus shifted. Furthermore, a device for carrying out said method is described, in which the signal processing section only comprises one shift register (R) and an adding circuit (AD), the additional shift being achieved by means of the wiring between the said shift register (R) and the adder circuit (AD), so that no further signal-processing registers are required for carrying out the said cumulative addition.

12 Claims, 5 Drawing Figures

METHOD OF ATTENUATING A DIGITAL SIGNAL AND DEVICE FOR CARRYING OUT SAID METHOD

This is a division of application Ser. No. 337,645, filed Jan. 7, 1982 abandoned.

BACKGROUND OF THE INVENTION

The invention relates to a method of modifying a first binary word, comprising a plurality of bits which represent the value of a first analog signal, in order to produce a second binary word, whose bits represent the value of a second analog signal, said last-mentioned value being in a predetermined ratio to the value of the first analog signal.

The invention further relates to a device for carrying out the method mentioned in the opening paragraph. Such a method is known from the article "A digital attenuator with 1 dB steps" in the Hewlett Packard Journal of January 1980, page 10. This article describes a method of attenuating pulse-modulated signals, which method can be carried out by means of a digital attenuator comprising two registers and an adder and is controlled by a suitable logic circuit. The known method is suitable for attenuating or amplifying a pulse-code modulated signal in 1 dB steps and is eminently suited for use in digitized measuring equipment. The known method provides an accurate attenuation or amplification but is so complex, that it is less suitable for use in simple signal processing equipment, such as playback equipment and receivers, where a smaller accuracy is needed and where it is important to achieve the desired result by simpler means.

SUMMARY OF THE INVENTION

It is an object of the invention to provide a digital-attenuation method which demands a minimum of components and is simple. To this end the method in accordance with the invention is characterized in that a third binary word is formed by shifting the first binary word by a predetermined first number of bit positions and that the second binary word is formed by shifting the third binary word a predetermined second number of times in the direction of the least significant bit by a predetermined third number of bit positions (suitable 3), and cumulatively adding it to said third binary word.

For carrying out the method in accordance with the invention it is advantageous to employ a device which is characterized in that it is provided with a shift register having a plurality of parallel inputs and a plurality of parallel outputs and furthermore an adding device having a plurality of parallel first inputs, a plurality of parallel second inputs and a plurality of parallel outputs, which adding device adds a binary word applied to the first inputs to a binary word applied to the second inputs and presents the result of the addition at its output, each of the first inputs of the adding device, being connected to one of the outputs of the shift register in accordance with its binary weight and each of a plurality of the second inputs of the adding device being connected to one of the outputs of the shift register, in such a way that the second inputs are shifted in the direction of the least significant bit by the second number, suitably 3, of bit positions relative to the first inputs of the adding device, and the remaining second inputs for which no output of the shift register is available, being connected to a point of constant logic level.

By the use of only one shift register and by deriving an attenuated signal for the second inputs of the adding device by means of the wiring, it is possible to adopt a simple control method.

Suitably, the device for carrying out the method in accordance with the invention is provided with means which permit a largely independent operation. To this end the device for carrying out the method in accordance with the invention is characterized in that said device is provided with a control circuit, which is connected to the shift register for applying a load signal and a shift signal to the shift register in accordance with a predetermined time pattern, which time pattern defines the ratio between the value of the first analog signal represented by the second binary word and the value of the second analog signal represented by the first binary word, the control circuit being provided with at least one input for applying a signal which defines the said time pattern.

Furthermore, it may be advantageous if the device for carrying out the method in accordance with the invention is provided with means for the serial application of the input signal, that is the first binary word, to the device. A first preferred embodiment of the device for carrying out the method in accordance with the invention is characterized in that each of the outputs of the adding device is connected to one of the parallel inputs of the shift register in accordance with its binary weight and the shift register is provided with a serial input, which is connected to a system input. The parallel inputs of the shift register in this first preferred embodiment may be permanently connected to the outputs of the adding device because the input signal is read in via the serial input of the shift register, the logic levels on the parallel inputs of the shift register having no effect.

However, it may also be advantageous to provide the device for carrying out the method in accordance with the invention with means for the parallel application of the input signal, that is the first binary word, to the device. A second preferred embodiment of the device for carrying out the method in accordance with the invention is characterized in that it is provided with a plurality of parallel system inputs and a plurality of two-position switches each having a master contact, a first contact and a second contact, the master contact of each of the two-position switches being solely connected to one of the parallel inputs of the shift register, the first contact of each of the two-position switches being connected to one of the parallel system inputs in accordance with the binary weight of the shift register input which is connected to the master contact of said two position switch, and the second contact of each of the two-position switches being connected to one of the outputs of the adding device in accordance with the binary weight of the shift register input which is connected to the master contact of said switch. In this second preferred embodiment it is necessary to make each of the inputs or the shift register connectable to one of the parallel system inputs and one of the outputs of the adding device, so as to permit both the input signal (the first binary word) and the output signal of the adding device to be applied separately to parallel inputs of the shift register.

In the second preferred embodiment it is advantageous, in view of the control of the device for carrying out the method in accordance with the invention, to construct the two-position switches so that said switches can be controlled by means of electric signals. A further embodiment of the device for carrying out the method in accordance with the invention is therefore characterized in that the two-position switches are constituted by electronic switches, which are incorporated in a selection circuit, provided with a control input for applying a control signal by means of which the two-position switches can be changed-over simultaneously.

DESCRIPTION OF THE DRAWING

The invention will now be described in more detail with reference to the drawing, in which.

DESCRIPTION OF THE PREFERRED EMBODIMENTS

Figure 1:
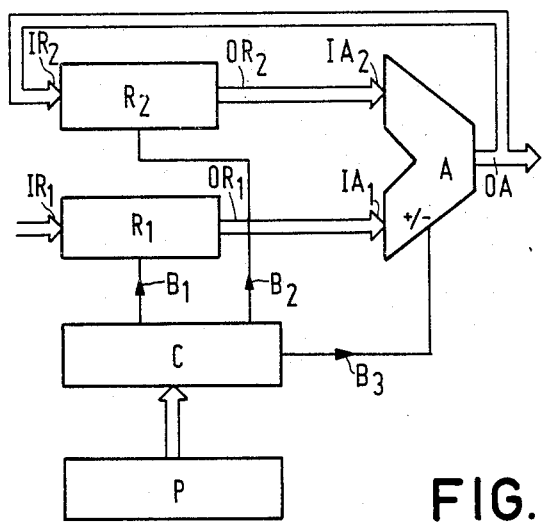
FIG. 1 shows the block diagram of a known digital attenuator.

FIG. 1 shows the block diagram of a digital attenuator described in the said article, which attenuator comprises a shift register $R_1$, a register $R_2$, an adder A and a control circuit C, which is controlled by the processor P.

The binary word to be modified is applied to the parallel inputs of the shift register $R_1$ (which are together designated $IR_1$). The parallel outputs of the shift register $R_1$ (together represented by $OR_1$) are connected to the inputs $IA_1$ of the adding device A in accordance with their binary weight. The outputs $OR_2$ of the register $R_2$ are connected to the inputs $IA_2$ of the adding device A in accordance with their binary weight and the inputs $IR_2$ of the register $R_2$ are connected to the outputs OA of the adding device A in accordance with their binary weight.

The processor P supplies the appropriate commands to the registers $R_1$ and $R_2$ and to the adding device A via the control circuit C and via the connections $B_1$, $B_2$ and $B_3$. These commands comprise load and shift commands for the shift register $R_1$, load commands for the register $R_2$ and add and subtract commands for the adding device A.

By loading the word to be modified into the shift register $R_1$ and subsequently performing a plurality of cycles comprising a shift command for the shift register $R_1$, an add (or subtract) command for the adding device A and a load command for the register $R_2$, or solely comprising a shift command for the shift register $R_1$, the desired attenuation factor or gain factor is obtained. Hereinafter, the operating principle will be explained. Shifting a digital word by one bit position in the direction of the least significant bit in a shift register corresponds to an attenuation of 6 dB. Shifting by one bit position in the other direction obviously results in a gain of 6 dB. An attenuation by an arbitrary number of dB's can be obtained by the summation of a sequence of words derived from the original first binary word, which are individually shifted by different numbers of bits and thus represent a series of attenuated analog signal values, which are each attenuated by an integral multiple of 6 dB relative to the original analog signal, for example, in accordance with:

$$AV_2 = AV_3(1 \pm (C_1 \times \tfrac{1}{2} + C_2 \times \tfrac{1}{4} + \ldots C_8 \times 1/256))$$

where $AV_2$ is the analog value, represented by the modified word, $AV_3$ the analog value corrsponding to the shifted original word, and $C_1$ to $C_8$ are coefficients, which are 0 or 1 and in the circuit arrangement of FIG. 1 are determined by a control algorithm of the processor P. Via the control bus $R_3$ said processor also determines whether at the location of the $\pm$ sign a $+$ or a $-$ is required, i.e. whether amplification or attenuation is required. It will be evident that in the present example any desired attenuation or gain factor can be approximated with 1/512 by a suitable choice of the coefficients $C_1 \ldots C_8$. For accurate measuring equipment, this may of course be necessary, but in cases where this is less essential, for example in audio equipment, it is advantageous to sacrifice part of this accuracy in order to simplify the device.

Figure 2:
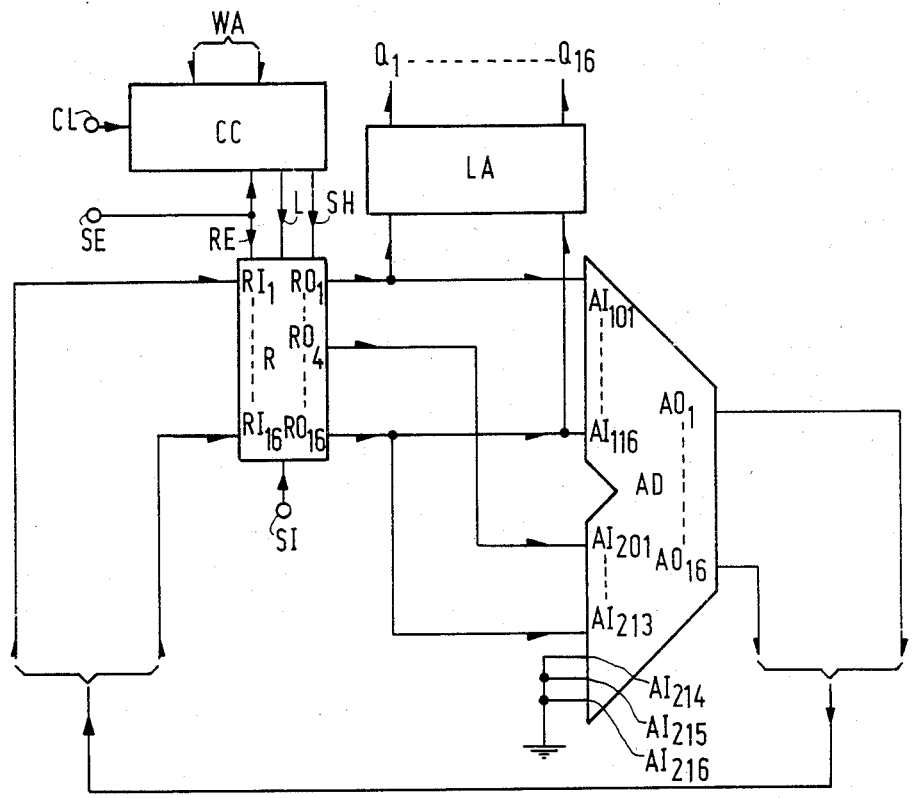
FIG. 2 shows the block diagram of a preferred embodiment of the device for carrying out the method in accordance with the invention, using serial input.

FIG. 2 represents the block diagram of a preferred embodiment of the device for carrying out the method in accordance with the invention using serial input and 16-bit binary signal paths. The device comprises the 16-bit shift register R, the adding device AD, the latch circuit LA, the control circuit CC. The parallel inputs $RI_1 \ldots RI_{16}$ of the shift register are connected to the outputs $AO_1 \ldots AO_{16}$ of the adding device AD in accordance with their binary weight. The parallel outputs $RO_1 \ldots RO_{16}$ of the shift register R are connected to the first inputs $AI_{101} \ldots AI_{116}$ of the adding device AD in accordance with their binary weight and via the buffer circuit LA they are each coupled to the system outputs $Q_1 \ldots Q_{16}$. The inputs $AI_{201} \ldots AI_{213}$ of the adding device AD are connected to the outputs $RO_4 \ldots RO_{16}$ of the shift register R and are thus shifted by 3 bit positions relative to the inputs $AI_{101} \ldots AI_{116}$ of the adding device AD. The remaining inputs $AI_{214} \ldots AI_{216}$ are connected to earth ("logic" 0), so that the value of the word on the inputs $AI_{201} \ldots AI_{216}$ is $2^{-3}x$ as great as that on the inputs $AI_{101} \ldots AI_{116}$. By loading the shift register R with the sum of the word already present in said register and the shifted word, a new word is stored, which is $(1+2^{-3}) = 1.125x$ as great as the word originally present in the shift register R, which corresponds to a gain of approximately 1 dB.

The operation during a modification cycle may now be as follows:

In synchronism with the bit frequency of the input signal, which frequency may be the same as that of the clock signal CL to be discussed hereinafter, the first binary word (input signal) is firstly shifted into the shift register R via the serial system input SI. This is effected by means of the signal SH. Assuming that during this shifting operation the most significant bit comes first, a coarse attenuation can already be obtained by applying by means of the signal SH a number of shift commands which is smaller than the number of bits (16) comprising the first binary word. A number of N shifting commands thus results in an attenuation of approximately $(16-N) \times 6$ dB.

By adding extra shifting commands to the normal sequence of 16, it is in principle also possible to obtain an amplification in steps of 6 dB, provided that no "overflow" occurs in the shift register R. The desired attenuation is obtained by firstly providing coarse attenuation in the manner described in the foregoing and then applying a number of times q a load command to the shift register R by means of the control signal L. Upon each load command the content of the shift register R is added to the content of said shift register R shifted by 3 bit positions in the direction of the least significant bit, which corresponds to a gain of approximately 1 dB. Thus, after q load commands a gain of q dB is obtained. By skipping p shift commands, in the manner described above, when loading the first binary word into the shift register R and subsequently giving a number of q load commands, an attenuation can be obtained which may be expressed as:

$$A \approx -p \times 6 + q \text{(dB)}.$$

As is shown in FIG. 2, the control signals L and SH are obtained from the control circuit CC, which is adapted to supply the signals L and SH in the correct pattern under the influence of a control signal WA (from for example a control element) and the clock signal CL. The modified word (second binary word) is available on the outputs $RO_1 \ldots RO_{16}$ of the shift register R, which are therefore coupled to the system outputs $Q_1 \ldots Q_{16}$ via the buffer circuit LA, which stores the second binary word last modified until the next one is defined, on which outputs the processed signal is available for further processing. At the beginning of each modification cycle the signal SE, which is applied to the input RE of the shift register R, makes the content of said shift register O, in order to prevent residual previous information from being added to the new information. The construction of the control circuit CC will be described in more detail after the description of FIG. 3.

Figure 3:
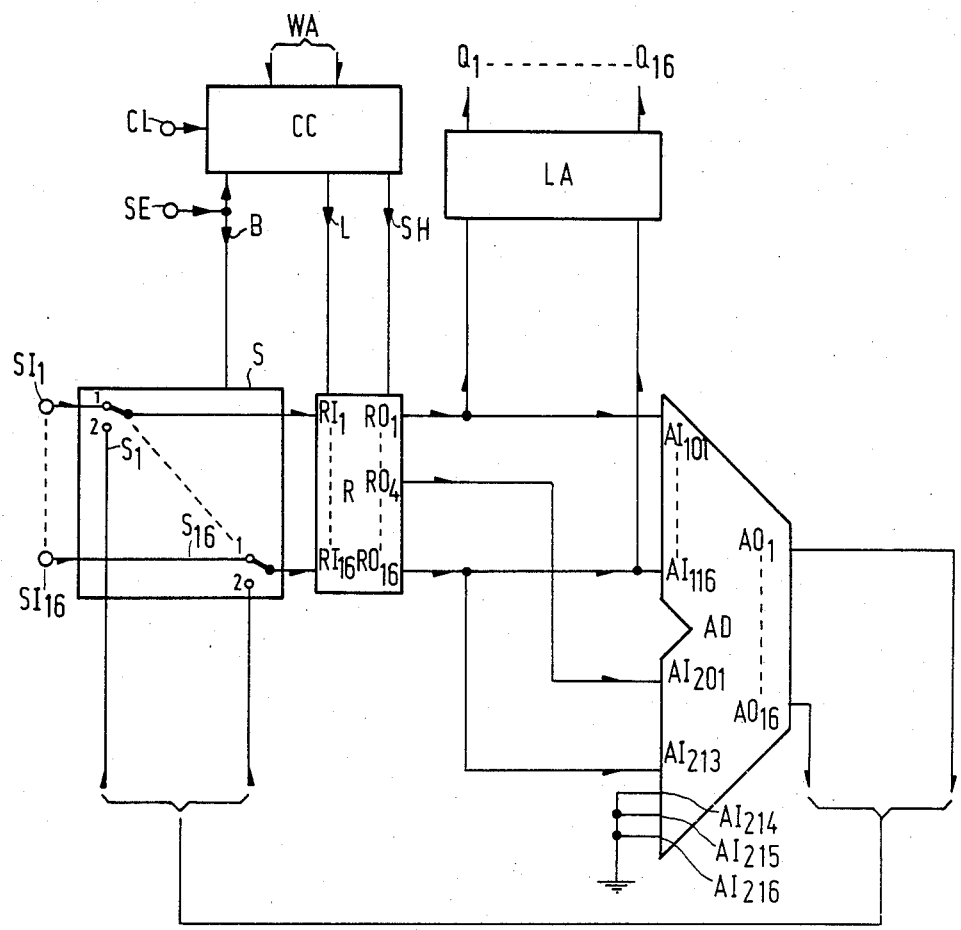
FIG. 3 shows the block diagram of a preferred embodiment of the device for carrying out the method in accordance with the invention, using parallel input.

FIG. 3 shows the block diagram of a preferred embodiment of the device for carrying out the method in accordance with the invention, using parallel input. Relative to the block diagram of FIG. 2 this diagram only exhibits the following differences: The shift register R has no serial input, or if it is present it is not used. In order to render the parallel inputs $RI_1 \ldots RI_{16}$ of the shift register alternately connectable to the parallel system inputs $SI_1 \ldots SI_{16}$ and the inputs $AO_1 \ldots AO_{16}$ of the adding circuit, the electronically controlled switches $S_1 \ldots S_{16}$ of the switching circuit S have been added. The operation of the digital attenuator of FIG. 3 is as follows:

By means of the control signal SE, which may be obtained from the system section preceding the digital attenuator now discussed and which is applied to input B of the switching circuit S, the switches $S_1 \ldots S_{16}$ are set to position 1, so that a first binary word applied to the parallel system inputs $SI_1 \ldots SI_{16}$ can be loaded into the shift register R by means of a load command L. Subsequently, the switches are all set to position 2 by means of the signal SE and by means of the signal SH as many shift commands are given as necessary for the coarse attenuation in steps of 6 dB.

As stated previously, p shift commands are necessary when the coarse attenuation should be 6 p dB. Subsequently, in the same way as in the procedure described with reference to FIG. 2, q load commands are given, so that again the final attenuation will be $$A = -6p + q \text{(dB)}.$$

The latch circuit LA functions in an identical manner as described with reference to FIG. 2.

Figure 4:
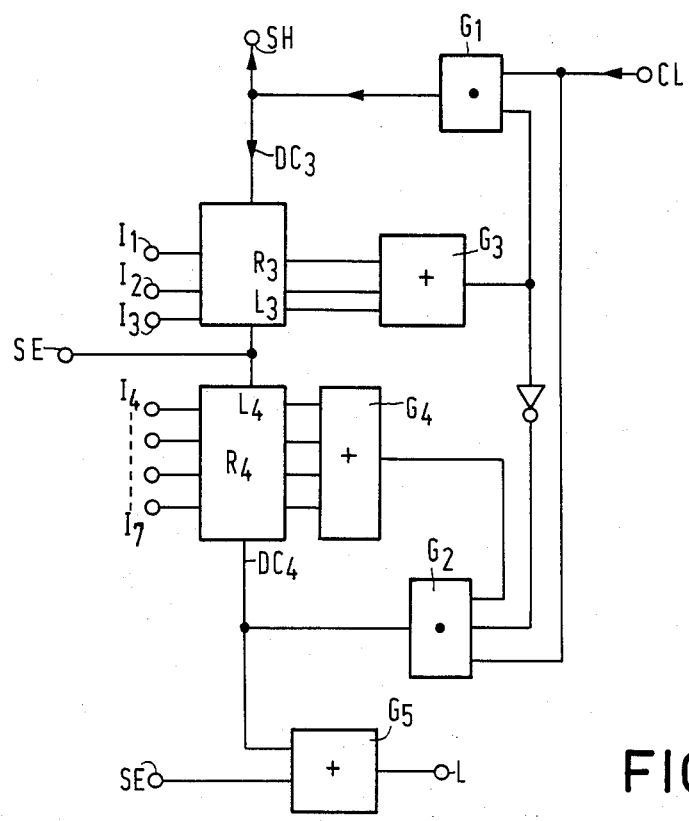
FIG. 4 shows an example of a block diagram of the control means for the device of FIG. 3.

In both cases the control circuit CC is adapted to supply the signals SH and L in the correct time pattern under the influence of a digital control signal WA and the clock signal CL. This may for example be achieved by designing the control circuit CC as is shown in FIG. 4. The description of the control circuit shown in this Figure will primarily be aimed at its use in the circuit of FIG. 3. The three most significant bits of the digital control signal WA are applied to the inputs $I_1$, $I_2$ and $I_3$ of the shift register $R_3$. These three bits determine the value of p, which in this case may range from 0 to 7. The other bits of the digital control signal are applied to the 4-bit counting register $R_4$, in which in a similar way the valve of q is stored. The storage of the values p and q is effected under the influence of the signal SE, which as already stated, may be obtained from the system section preceding the digital attenuator being discussed, and which is applied to the load inputs $L_3$ and $L_4$ of the counting registers $R_3$ and $R_4$ respectively. After the counting registers $R_3$ and $R_4$ have been loaded, the first register $R_3$ starts to count down. This is effected under the influence of the clock signal CL, which may also be used in other parts of the system in which the digital attenuator is included. Via the AND-gate $G_1$ said clock signal is applied to the clock input $DC_3$ of the counting register $R_3$. The clock signal which appears on the output of the AND-gate $G_1$ also serves as the signal SH, which is applied to the shift register R of FIG. 3. When the counting register $R_3$ has received p clock pulses it has reached the position 0, which is detected by means of the OR-gate $G_3$, whose inputs are each connected to an output of the counting register $R_3$.

The output of the OR-gate $G_3$, which initially was "1", then becomes "0" and as a result of this the AND-gate $G_1$ is blocked and the AND-gate $G_2$ is opened. The clock signal CL can now reach the input $DC_4$ of the counting register $R_4$, so that said counting register begins to count down. The clock signal which appears on the output of the AND-gate $G_2$ is combined with the signal SE (delayed, if necessary) by means of the AND-gate $G_5$, which combination yields the control signal L. This is effected in order to load the shift register R with the first binary word at the beginning of the modifying signals. When after the start of the count-down by the counting register $R_4$ q clock pulses have been counted, said counting register has reached the position "0" and counting is stopped under the influence of the feedback via the AND-gate $G_4$.

Figure 5:
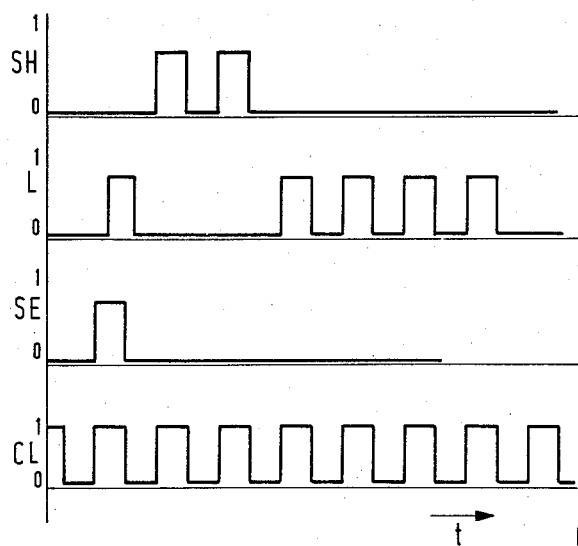
FIG. 5 shows an example of a time diagram representing the control signals used in the circuits of the FIGS. 2, 3 and 4.

FIG. 5 shows an example of a time diagram in accordance with which the signals C, SE, SH and L in the control circuit CC discussed here vary in the case of a specific control signal WA during one modification cycle. The clock signal CL, which is also used elsewhere in the system, is continuously available.

The signal SE is generated in synchronism with the clock signal in a section of the system which precedes the digital attenuator and serves to start the modification cycle.

FIG. 5 represents the delayed pulse of the signal SE combined with the signal L in order to load the shift register R with the first binary word after the switches $S_1 \ldots S_{16}$ of FIG. 3 have been set to the correct position (1). This is followed by the actual modification cycle, in which the signal WA determines the numbers p (shift commands) and q (load commands). In this case p=2, which causes the two pulses of the signal SH, and q=4, which causes the 4 last pulses of the signal L. Consequently, the attenuation is then $A = -2 \times 6 + 4 = -8$ dB.

After a slight modification the control circuit of FIG. 4 may also be employed in the circuit arrangement of FIG. 2.

For this purpose the OR-gate $G_5$ is included in the signal line for the signal SH instead of in that for the signal L, as shown in FIG. 4. As a result of this, the signal SE (as the case may be delayed) is added to the signal SH. This last situation is not shown in FIGS. 4 and 5. However, there is a further difference, namely when the circuit of FIG. 4 is employed in that of FIG. 3, the value of p should be stored in the counting register $R_3$, whilst in the control circuit adapted to control the attenuator of FIG. 2 this should be (16-p), because in that case the coarse attenuation (in steps of 6 dB) is determined by the shift commands that are skipped.

What is claimed is:

1. Apparatus for modifying a first binary word comprising a plurality of bits representing the value of a first analog signal to produce a second binary word having a plurality of bits representing the value of a second analog signal, said last mentioned value being in a predetermined ratio to the value of said first analog signal, comprising a colon a shift register having a plurality of parallel inputs and a plurality of parallel outputs; an adding device having a plurality of parallel first inputs, a plurality of parallel second inputs, and a plurality of parallel outputs, for adding a binary word applied to said first inputs to a binary word applied to said second inputs and presenting the result of the addition at its outputs; means for connecting each of said first inputs of said adding device to one of the outputs of the shift register in accordance with its binary weight and for connecting each of a plurality of the second inputs of said adding device to one of said shift register outputs; in such a way that said second inputs are shifted in the direction of the least significant bit relative to said first inputs of said adding device; and means for connecting the remaining second inputs of said adding device, for which no output of the shift register is available, to a point of constant logic level.

2. Apparatus as claimed in claim 1, further comprising a control circuit which is connected to the shift register for applying a load signal and a shift signal to the shift register in accordance with a predetermined time pattern, which time pattern defines the ratio between the value of the first analog signal represented by the first binary word and the value of the second analog signal represented by the second binary word, the control circuit being provided with at least one input for receiving a signal which defines said time pattern.

3. Apparatus as claimed in claim 2, wherein each of the outputs of the adding device is connected to one of the parallel inputs of the shift register in accordance with its binary weight and the shift register further comprises a serial input adapted to be connected to an input.

4. Apparatus as claimed in claim 2, further comprising a plurality of parallel inputs to said apparatus and a plurality of two-position switches each having a master contact, a first contact and a second contact, the master contact of each of the two-position switches being solely connected to one of the parallel inputs of the shift register, the first contact of each of the two-position switches being connected to one of the parallel inputs to said apparatus in accordance with the binary weight of the input of the shift register which is connected to the master contact of said two-position switch, and the second contact of each of the two-position switches being connected to one of the outputs of the adding device in accordance with the binary weight of the input of the shift register which is connected to the master contact of said switch.

5. Apparatus as claimed in claim 4, further comprising a selection circuit, the two-position switches being electronic switches which are incorporated in said selection circuit, said selection circuit being provided with a control input for receiving a control signal by means of which the two-position switches can be switched simultaneously.

6. Apparatus as claimed in claim 5 wherein the control circuit comprises a further input for receiving the control signal.

7. Apparatus according to claim 1 further comprising means for producing a load signal connected to said shift register, means for producing a shift signal connected to said shift register, and a control circuit connected to said shift register for applying said load signal and said shift signal to the shift register at predetermined times which are a function of the value represented by the first binary word and the value represented by the second binary word.

8. Apparatus according to claim 7 wherein the outputs of the adding device are connected to the inputs of the shift register.

9. A method of modifying a first binary word having a plurality of bits representing the value of a first analog signal to produce a second binary word having a plurality of bits representing the value of a second analog signal, said last mentioned value being in a predetermined ratio to said first mentioned value, comprising the steps of:

entering said first binary word into a register having a plurality of outputs at least equal in number to the number of bits in said first binary word, thereby creating a plurality of output signals representing bits ranging in binary weight from a most significant binary position to successively less significant binary positions;

directly applying said register output signals to respective first summing inputs of summing circuit means in accordance with the binary weights of this positions, thereby creating a first plurality of summing signals representing the binary values of said register output signals;

further directly applying said register output signals to respective second summing inputs of said summing circuit means in such a way that such signals are shifted in the direction of the least significant binary position relative to the binary positions of the signals applied to said first summing inputs, thereby creating a second plurality of summing signal representing the binary values of said shifted output signals; and summing said first and second summing signals, thereby creating a plurality of summed signals respectively representing the bits of said second binary word.

10. A method as set forth in claim 9, wherein said summing circuit means comprises binary attenuating means, whereby said value of said first analog signal is attenuated in the course of creating said value of said second analog signal.

11. A method as set forth in claim 9, further comprising the step of applying said summed signals to said register whereby upon repetition of said applying and summing steps a third binary word representing an analog value having said predetermined ratio to the analog value of said second binary word and therefore a second ratio to said value of said first analog signal is produced at the outputs of said summing circuit.

12. Apparatus for modifying a first binary word having a plurality of bits which represent a first analog value in order to produce a second binary word having a plurality of bits which represent a second analog value in predetermined ratio to said first analog value, comprising:

loading means for producing a loading signal;

shift register means operatively connected to said loading means for loading said first binary word therein in response to said loading signal, said shift register means having a plurality of outputs corresponding to binary weighted positions ranging from a most significant binary value to less significant binary values;

accumulator means having first and second groups of multi-bit inputs, the inputs of each of said groups corresponding to binary weighted positions ranging from a most significant binary value to less significant binary values, said accumulator means further having a plurality of outputs at which it is adapted to produce output signals representing the binary sum of the signals applied to said first and second groups of multi-bit inputs;

and means for directly applying said shift register outputs to each of first and second groups of multi-bit inputs of said accumulator means, each of said groups of inputs corresponding to successively increasing binary weighted positions, the most significant bit of the shift register output being positioned at the most significant binary weighted position of said first group of inputs and at less than the most significant binary weighted position of said second group of inputs, whereby said accumulator means produces output signals representing said second binary word.

* * * * *

UNITED STATES PATENT AND TRADEMARK OFFICE
CERTIFICATE OF CORRECTION

PATENT NO. : 4,566,076
DATED : January 21, 1986
INVENTOR(S) : ANTONIE C.A.M. VAN DER STEEN It is certified that error appears in the above-identified patent and that said Letters Patent is hereby corrected as shown below:

Claim 1, line 7, change "a colon" to a colon --:--

Signed and Sealed this

Thirteenth Day of October, 1987

Attest:

DONALD J. QUIGG

Attesting Officer

Commissioner of Patents and Trademarks